US006879869B2

(12) United States Patent
Kou

(10) Patent No.: US 6,879,869 B2
(45) Date of Patent: Apr. 12, 2005

(54) PLACEMENT OF ELECTRONIC COMPONENTS

(75) Inventor: Yuen-Foo Michael Kou, Andover, MA (US)

(73) Assignee: Accu-Assembly Incorporated, MA (US)

( * ) Notice: Subject to any disclaimer, the term of this patent is extended or adjusted under 35 U.S.C. 154(b) by 200 days.

(21) Appl. No.: 10/402,191

(22) Filed: Mar. 28, 2003

(65) Prior Publication Data

US 2004/0193302 A1 Sep. 30, 2004

(51) Int. Cl.[7] .............................................. G06F 19/00
(52) U.S. Cl. ....................................................... 700/117
(58) Field of Search ........................ 700/114, 116–121, 700/219–221, 225, 226; 29/832–834

(56) References Cited

U.S. PATENT DOCUMENTS

| | | | |
|---|---|---|---|
| 3,968,755 A | 7/1976 | Lester ......................... 108/150 |
| 4,175,654 A | 11/1979 | Lodge ......................... 198/398 |
| 4,242,632 A | 12/1980 | Irvin ........................... 324/537 |
| 4,426,619 A | 1/1984 | Demand ...................... 324/760 |
| 4,527,326 A | * 7/1985 | Kohno et al. ................. 29/705 |
| 4,684,884 A | 8/1987 | Soderlund .................. 324/71.1 |
| 4,939,469 A | 7/1990 | Ludwig et al. .............. 324/694 |
| 5,024,532 A | 6/1991 | Rall ............................. 374/28 |
| 5,145,047 A | * 9/1992 | Terracol et al. ......... 198/341.02 |
| 5,155,888 A | 10/1992 | Lau ............................ 29/25.01 |
| 5,157,617 A | 10/1992 | Ramsey ...................... 700/223 |
| 5,283,943 A | 2/1994 | Aguayo et al. ............... 29/701 |
| 5,434,737 A | 7/1995 | Miura ......................... 360/133 |
| 5,443,534 A | * 8/1995 | Vinciarelli et al. ............ 29/593 |
| 5,450,018 A | 9/1995 | Rieser et al. ............... 324/760 |
| 5,455,409 A | 10/1995 | Smith et al. ................. 235/385 |
| 5,455,894 A | * 10/1995 | Conboy et al. ............. 700/247 |
| 5,515,600 A | 5/1996 | Iwasaki et al. ............... 29/740 |
| 5,553,376 A | 9/1996 | Solanki et al. ................ 29/833 |
| 5,567,927 A | 10/1996 | Kahn et al. ............. 235/462.01 |

(Continued)

FOREIGN PATENT DOCUMENTS

| | | |
|---|---|---|
| DE | 2436439 | 2/1976 |
| EP | 0123972 | 11/1984 |
| EP | 0476577 | 3/1992 |
| GB | 1494407 | 12/1977 |
| JP | 6-6076 | 1/1994 |
| JP | 6-6077 | 1/1994 |
| JP | 6-6098 | 1/1994 |
| JP | 6-042986 | 2/1994 |

OTHER PUBLICATIONS

"Joint Industry Standard", IPC/JEDEC J–STD–033, Apr. 1999.

(Continued)

*Primary Examiner*—Maria N. Von Buhr
(74) *Attorney, Agent, or Firm*—Fish & Richardson P.C.

(57) ABSTRACT

An electronic component placement machine is disclosed that includes a series of feeders adapted to supply discrete electronic components for subsequent placement onto a destination circuit board; at least one data module coupled to each feeder, each data module comprising a memory storage device; at least one communications module coupled to each feeder, each communications module comprising a data module-transceiver coupled to a memory storage device of the associated data module; a pick head, movable between selected feeders for sequentially picking the discrete electronic components from a respective feeders for subsequent placement onto a destination circuit board; and a pick head-transceiver secured to the pick head for movement therewith between feeders, the pick head-transceiver arranged to communicate over a duplex communications channel with a data module-transceiver of a selected feeder when the pick head is positioned to pick from the selected feeder.

40 Claims, 6 Drawing Sheets

U.S. PATENT DOCUMENTS

| | | | |
|---|---|---|---|
| 5,606,264 A | 2/1997 | Licari et al. | 324/763 |
| 5,659,440 A | 8/1997 | Acosta et al. | 360/92 |
| 5,713,125 A | 2/1998 | Watanabe et al. | 29/833 |
| 5,764,073 A | 6/1998 | Sadamatsu | 324/765 |
| 5,838,574 A | 11/1998 | Olson et al. | 700/219 |
| 5,844,593 A | 12/1998 | Proffitt et al. | 347/262 |
| 5,867,809 A | 2/1999 | Soga et al. | 702/130 |
| 6,027,019 A | 2/2000 | Kou | 235/375 |
| 6,031,242 A | 2/2000 | Hudson | 250/548 |
| 6,045,653 A | 4/2000 | Johnson | 156/292 |
| 6,113,262 A | 9/2000 | Purola et al. | 374/45 |
| 6,505,093 B1 * | 1/2003 | Thatcher et al. | 700/216 |
| 6,530,517 B1 | 3/2003 | Kou | 235/375 |
| 6,618,629 B2 * | 9/2003 | Martens et al. | 700/9 |
| 6,675,056 B1 * | 1/2004 | Black et al. | 700/116 |
| 6,816,751 B1 * | 11/2004 | Alice et al. | 700/222 |
| 2003/0030429 A1 | 2/2003 | Kou | |
| 2003/0102367 A1 | 6/2003 | Monette et al. | 700/108 |
| 2003/0135296 A1 * | 7/2003 | Martens et al. | 700/117 |

OTHER PUBLICATIONS

"Microchip PIC12C67X", © 1999 Microchip Technology Inc.

Awtrey et al., "A1–Wire Humidity Sensor", Sensors The Journal of Applied Sensing Technology, no date.

"Dallas Semiconductor, DS2438 Smart Battery Monitor", www.dalsemi.com, Apr. 10, 2001, pp 1–29.

"Humidity Sensors Relative Humidity", Honeywell HIH Series, pp 99, 100, no date.

"Cytherm Temperature Data Logger Key", Dynasys Technologies Inc., no date.

* cited by examiner

PLACEMENT OF ELECTRONIC COMPONENTS

BACKGROUND

This invention relates to placing electronic components upon printed circuit boards and the like.

Electronic component feeders can hold many discrete electronic components. These feeders can be coupled to a component placement machine so that the components positioned thereon can be removed by a pick head for subsequent placement onto a destination circuit board. Component feeders can include, for example, component carrier tapes spooled onto a reel or trays of components in drawers of a tower. One or more pick heads may be used to remove components from a feeder.

Electronic component placement machine operations can be enhanced.

SUMMARY OF THE INVENTION

One aspect of the invention includes an electronic component placement machine with a series of feeders adapted to supply discrete electronic components for subsequent placement onto a destination circuit board. At least one data module with a memory storage device and one communications module is coupled to each feeder. Each communications module has a transceiver. The transceiver is coupled to a memory storage device of the associated data module. The placement machine also includes a pick head that is movable between selected feeders and capable of sequentially picking discrete electronic components from each feeder for subsequent placement onto a destination circuit board. A pick head-transceiver is secured to the pick head for movement therewith between feeders. The pick head-transceiver is capable of communicating with the data module-transceiver over a duplex communications channel when the associated pick head is positioned to remove components from the selected feeder.

In some instances, the memory storage device of the data module is adapted to store a remaining inventory value that indicates the number of discrete electronic components that are available at the associated feeder. In such instances, the data module transceiver transmits the stored remaining inventory value to the pick head transceiver over the duplex communications channel. Additionally, in such instances, the pick head transceiver is adapted to transmit a signal to the data module transceiver to indicate that the pick head has removed a component from the selected feeder and the remaining inventory value in the memory storage device is decremented in response to the received signal. Furthermore, in such instances, the pick head transceiver includes a memory storage unit adapted to store values that indicate a minimum acceptable inventory of available electronic components at each feeder and a processing unit coupled to the memory storage unit. In certain implementations, the processing unit is adapted to compare the transmitted remaining inventory value with the stored minimum acceptable inventory value associated with the selected feeder.

Certain embodiments include data modules that have a sensing element responsive to some environmental parameter, such as atmospheric moisture content, and a processing unit adapted to store data associated with sensed atmospheric moisture content over time in the memory storage device. In such embodiments, the data module-transceiver associated with the selected feeder will transmit data associated with the sensed atmospheric moisture content over time to the pick head-transceiver when the pick head is positioned to remove components from the selected feeder. Additionally, in such embodiments, the data module includes a processing unit that is adapted to determine, based on the stored data associated with the sensed atmospheric moisture content over time, whether the electronic components of the selected feeder are suitable for subsequent installation into an electronic circuit board. In some implementations, the data module transceiver is adapted to transmit data indicating suitability for installation of the electronic components of the selected feeder to the pick head-transceiver over the duplex communications channel.

The duplex communications channel utilizes either wireless or hard-wired technology. If wireless technology is used, it may be, for example, either radio-frequency (RF) based or infrared (IR) based.

In some embodiments, the memory storage device of the data module stores identification data associated with the discrete electronic components of the associated feeder. According to such embodiments, the data module-transceiver is adapted to communicate this stored component identification data to the pick head-transceiver. Also, in such embodiments, the pick head-transceiver includes a memory unit and a processor coupled to each other. The processor is adapted to store the communicated component identification data in the memory unit. In some instances, the pick head transceiver is also adapted to receive circuit board identification data by scanning a marker that is secured to the destination circuit board and to create an association between the stored component identification data and the circuit board identification data associated with the destination circuit board. Also, in some embodiments, the memory storage unit of the pick head transceiver is adapted to store a predetermined sequence of data associated with a desired parts installation and the processor of the pick head transceiver is adapted to compare the communicated identification data with the predetermined sequence of data. The pick-head processor then alerts an operator if the communicated identification data does not match the predetermined sequence of data.

In certain embodiments, the data module is detachable from the communications module. Such data modules further include a first power source and such communications modules includes a second power source (e.g., either a battery or wall outlet power) dedicated to the data module transceiver.

According to a certain implementation, the electronic component placement machine includes a plurality of pick heads coupled to a periphery of a rotatable turret and, the plurality of feeders is arranged in linear fashion and is movable in a linear direction.

Another aspect of the invention features a method of operating an electronic component placement machine. This method includes positioning a pick head proximate a selected one of a plurality of electronic component feeders, establishing a duplex communication channel between a pick head transceiver coupled to the pick head and a data module transceiver coupled to the selected feeder, reel, or tray of components, transmitting operational data between the pick head transceiver and the data module transceiver over the duplex communications channel, disengaging the duplex communications channel, and positioning the pick head proximate a second selected feeder.

In some arrangements, the plurality of feeders is arranged in linear fashion and is substantially stationary, and positioning the pick head proximate the selected feeder comprises moving the pick head. In other embodiments, the pick head is one of a plurality of pick heads coupled to a periphery of a rotatable turret and the plurality of feeders is arranged in linear fashion and is movable in a linear direction. In that situation, positioning the pick head and the selected feeder proximate each other includes rotating the turret and moving the plurality of feeders in the linear direction. In yet another embodiment, the plurality of feeders comprises a plurality of trays. In that case, positioning the pick head and the selected feeder proximate each other includes positioning the pick head above (i.e., proximate) a selected tray.

According to certain embodiments, the method includes communicating over a hard-wired or a wireless communication channel based on either infrared (IR) or radio-frequency (RF) technology. Either way, the communications channel will generally be established when the pick head and the selected feeder are proximate each other.

Transmitting the operational data generally includes transmitting identification data associated with the electronic components of the selected feeder. The method also includes, in certain instances, determining whether the transmitted identification data matches a predetermined sequence of data associated with a desired parts installation. Furthermore, certain embodiments include transmitting moisture exposure data associated with the electronic components of the selected feeder, and alerting an operator if the transmitted moisture exposure data is not acceptable. Following such an alert condition, some implementations include preventing the pick head from picking a component from the selected feeder. Some instances include transmitting data that indicates available inventory at the selected feeder and alerting an operator if the available inventory data indicates a value below a predetermined threshold value.

In some embodiments, the method includes removing an electronic component from the selected feeder and sending a signal indicating that a component has been removed. Following receipt of such a signal, the available inventory value associated with the selected feeder is updated (i.e., decremented) and the updated value may be stored in a memory storage device coupled to the selected feeder.

Several advantages may be realized through various aspects of the invention. For example, the data module and communications module described herein can be coupled to a set of components, and remain secured there throughout the life span of the components, thereby providing ongoing tracking of component suitability for installation, component availability, etc. Checking of component suitability for installation may be performed automatically, before placing any incorrect components on a particular circuit board. Additionally, the accuracy and ease of component tracking may be improved. Moreover, various aspects of the invention may result in financial savings associated with electronic component placement machine operation and maintenance.

DETAILED DESCRIPTION OF THE DRAWINGS

Figure 1:
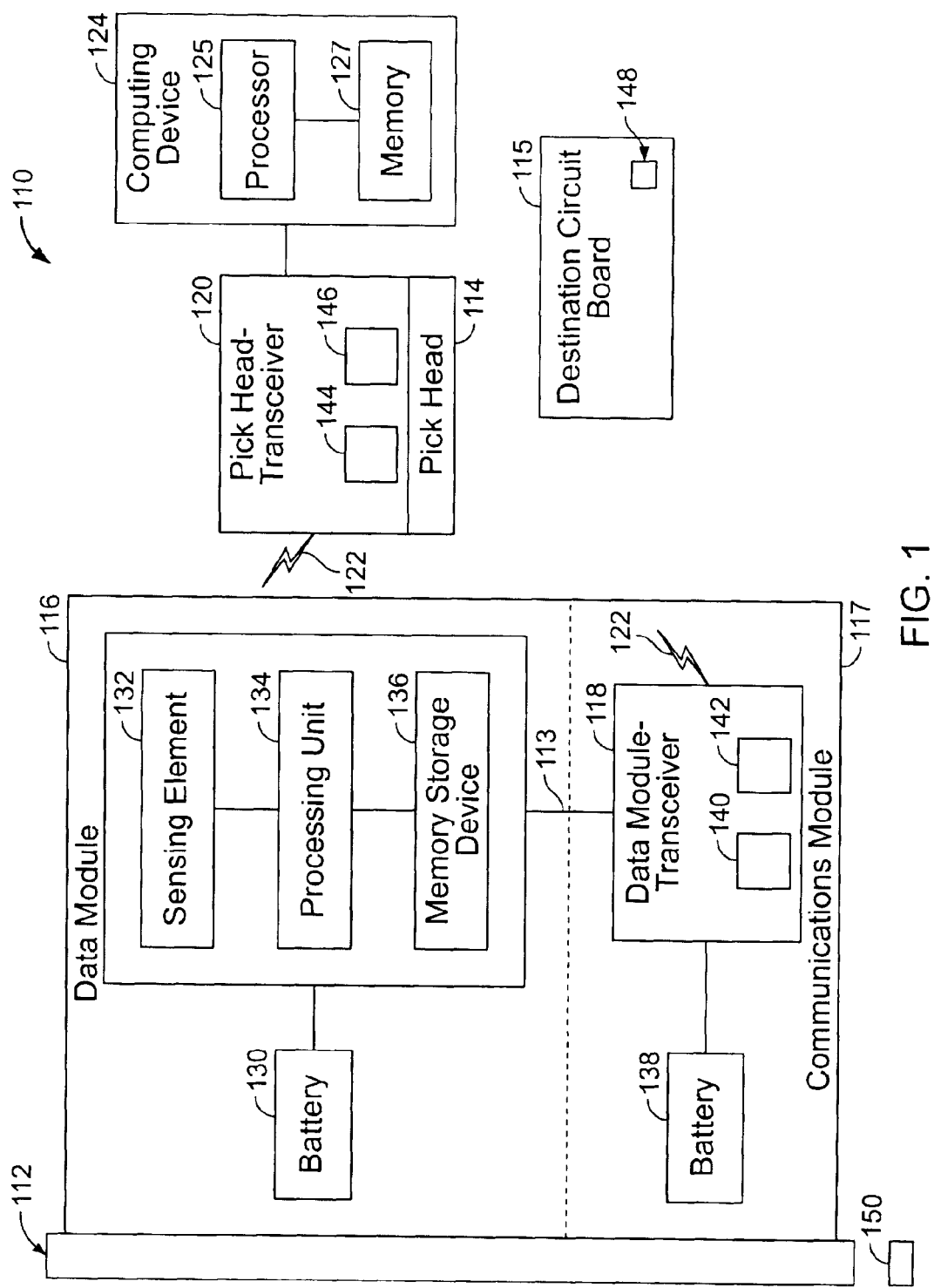
FIG. 1 illustrates a system block diagram of a component placement machine.

FIG. 1 illustrates an electronic component placement machine 110 for mounting electronic components (e.g., surface mount components) on printed circuit boards and the like. The illustrated configuration includes a feeder 112 and a pick head 114. The feeder 112 may include, for example, a reel or tray of components, suitable for supplying discrete electronic components for subsequent placement upon a destination circuit board 115. The terms reel or tray of components, as used herein, shall be construed to include any arrangement of electronic components, suitable for providing such components to a placement machine for subsequent placement upon a destination circuit board. The feeder 112 and the pick head 114 are movable in a manner relative to each other so that the latter can remove an electronic component from the former and subsequently place that component onto the destination circuit board 15.

In the illustrated embodiment, a data module 116 and a communications module 117 are securely coupled to the feeder 112 for motion therewith. In some embodiments, the data module 116 may be securely coupled to a reel or tray of components; in such an embodiment, the data module 116 can travel with the reel or tray of components from place to place. For example, an associated data module 116 may be coupled to a particular reel of components stored in a storage facility; if that reel is moved from the storage facility to a placement machine, so too is the data module 116; and if that reel is subsequently mounted to the placement machine, the data module 116 may, at that time establish a communications link 113 with an associated communications module 117, attached to the feeder 112. That communications link 113 may be either a wireless or hard-wired link. Alternatively, the communications module 117 may be directly attached to the data module 116 so that it too would travel along with the reel or tray of electronic components from place to place.

The data module 116 includes a battery 130, a sensing element 132, a processing unit 134 and a memory storage device 136. The sensing element 132 can be adapted to sense and/or monitor any number of environmental parameters. These environmental parameters may include, for example, exposure to ambient atmospheric moisture content, temperature, humidity, mechanical shock or vibration, etc. The processing unit 134 can process data obtained by the sensing element 132 and store information based on that data in the memory storage device 136. The processing unit 134 can also access data stored within the memory storage device 136, process that data and store any resultant data in the memory storage device 136.

The memory storage device 136 can also store various information useful in identifying electronic components of the associated feeder 112. Such information may include, for example, component part numbers, serial numbers, lot numbers, and other useful identification information.

The communications module 117 includes a battery 138 and a data module transceiver 118. In certain embodiments the communications module 117 may be powered by a power supply other than a battery, such as a wall outlet, etc. The data module transceiver 118 includes an internal processor 140 and an internal memory unit 142.

A pick head transceiver 120 is securely fastened to the pick head 114 for motion therewith. The pick head transceiver 120 includes a local processor 144 and a local memory storage device 146. The processor 144 and memory storage device 146 may be adapted to control various operational aspects of the electronic component placement machine 110. The pick head transceiver 120, as shown, is coupled to a remote computing device 124, which also may be adapted to control various operational aspects of the electronic component placement machine 110. This remote computing device 124 includes a processor 125 and a memory storage unit 127.

The data module transceiver 118 and the pick head transceiver 120 are adapted to communicate with each other over a duplex communications channel 122 when they are moved close to each other. The duplex communications channel 122 may be implemented through either wireless or hard-wired communication technology. Exemplary wireless technologies include infrared-based (IR) communication and radio frequency-based (RF) communication. Exemplary hard-wired technologies include RS232, USB, and Firewall.

The data module transceiver 118 can retrieve data from either the local memory unit 142 or the memory storage device 136 of the data module 116 and transmit that data to the pick head transceiver 120 over the duplex communication channel 122. The data module transceiver 118 can also receive data transmitted by the pick head transceiver 120 and store that information in either the local memory unit 142 or in the memory storage device 136 of the data module 116. Similarly, the pick head transceiver 120 can retrieve data from either the memory storage device 146 or the memory storage unit 127 and transmit that data to the data module transceiver 118 over the duplex communication channel 122. The pick head transceiver 120 can also receive data from the duplex communications channel 122 and store that data in either the memory storage device 146 or the memory storage unit 127. The processor 144 of the pick head transceiver 120 is capable of processing any data that is handled by the pick head transceiver 120.

The pick head transceiver 120 is also capable of reading information from an identification marker 148 placed upon the destination circuit board 148. Such circuit board information may include, for example, a serial number, a part number, etc. This information may be stored by the pick head transceiver 120 in either the local memory storage device 146 or the memory storage unit 127. The pick head transceiver 120 is also capable of reading information from a slot marker 150. The slot marker 150 includes information identifying the position of the feeder 112 within the electronic component placement machine 110. This information may be stored by the pick head transceiver 120 in either the local memory storage device 146 or the memory storage unit 127. Both the identification marker 148 on the circuit board 148 and the slot marker 150 may be, for example, bar codes.

Typical electronic component placement machines 110 include several feeders 112 and may include more than one pick head 114. In such an embodiment, each feeder 112 would have a corresponding data module 116 and communication module 117 coupled thereto and each pick head 114 would have a corresponding pick head transceiver 120 coupled thereto.

Figure 2:
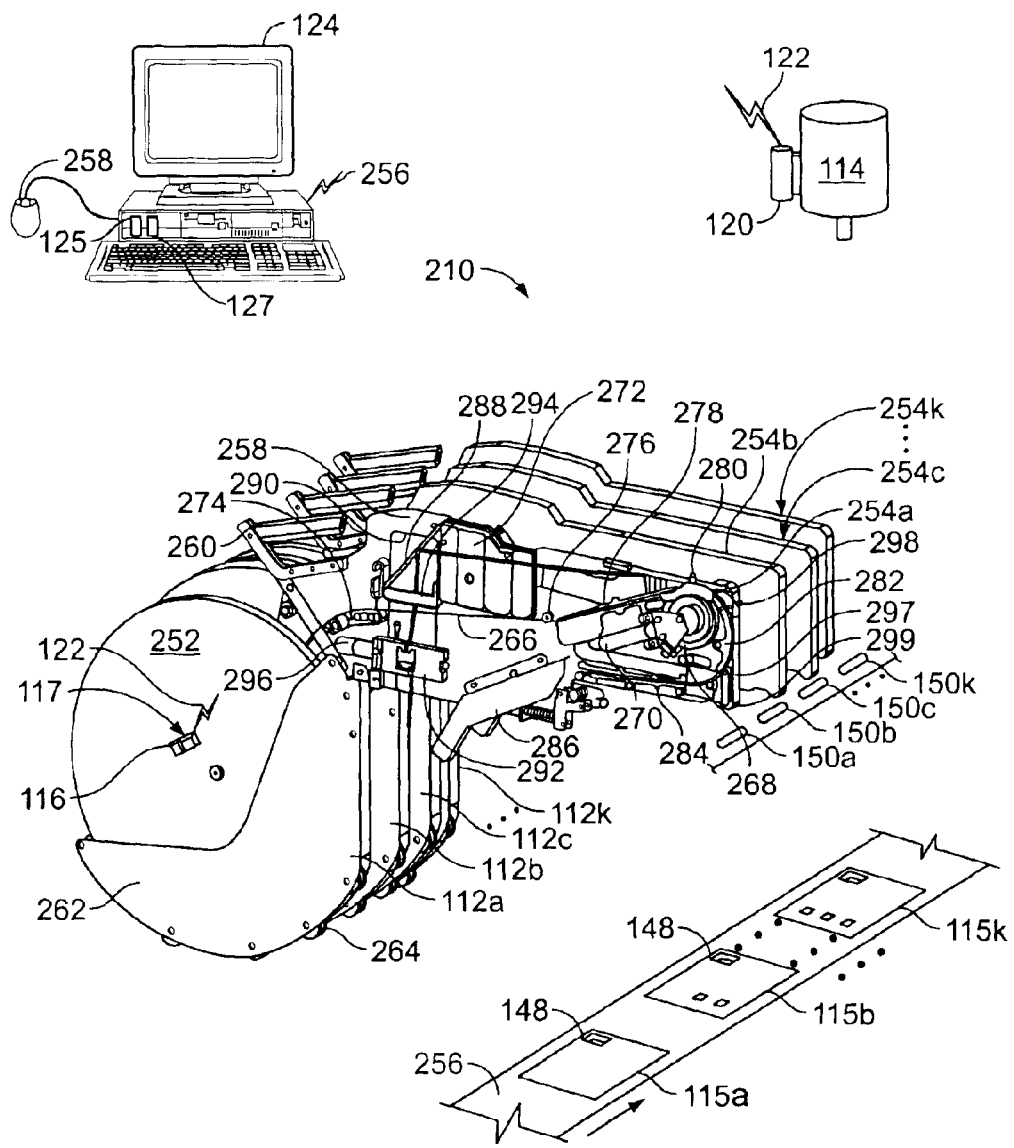
FIG. 2 illustrates a component placement machine.

Referring now to the particular embodiment of FIG. 2, an electronic component placement machine 210 includes a series of electronic component feeders 112a, 112b, 112c . . . 112k positioned within corresponding feeder slots (not shown). Each feeder 112a, 112b, 112c . . . 112k contains a reel, for example reel 252, loaded with a length of component carrier tape having discrete electronic components mounted thereon. The component placement machine 210 also includes a pick head 114 that is movable in such a manner that it can remove components in a sequential manner from selected ones of the plurality of available component carrier tapes for subsequent placement upon a destination circuit board, for example, one of either 115a, 115b . . . 115k. The pick head 114 can remove components from any selected one of the available feeders 112a, 112b, 112c . . . 112k at respective pick areas 254a, 254b, 254c . . . 254k. The electronic component placement machine 210 also includes a circuit board positioning mechanism 256, which, in the illustrated embodiment is a conveyer belt upon which circuit boards 115a, 115b . . . 115k are positioned.

A computing device 124, containing a processing unit 125 and a memory storage unit 127, is coupled to the component placement machine 210 via a communications link 256 and can process and/or store various data related to machine 210 operations. A data entry device 258 is coupled to the computing device 124 to enable a machine operator to enter various data associated with reels and circuit boards that are handled by the machine 210.

Electronic component feeder 112a includes a base plate 258 provided with a handle 260. Reel cassette 262 is secured to the base plate 258 and opens upward. Reel 252 is resting within the reel cassette 262 and is freely rotatable within the cassette 262 on a plurality of rollers 264 positioned at the lower part of the reel cassette 262.

A length of tape 266 passes from reel 252, through a central part of the feeder and to a front part of the feeder, where, at a pickup position 254a, the pick head 114 can remove a component from the length of tape. The pick head 114 is positionable to remove a discrete electronic component from a pickup position 254a, 254b, 254c . . . 254k of any selected one of the available feeders 112a, 112b, 112c . . . 112k and for depositing the thus removed electronic component upon a destination circuit board for example, one of either 115a, 115b . . . 115k. The pick head 114 is typically mounted on a movable mechanical limb (not shown). The pick head 114 may use any technique known in the art for removing the component, such as, using vacuum sources, mechanical gripping elements or adhesives materials. In a typical embodiment, a single pick head 114 can sequentially remove discrete electronic components from a plurality of available feeders 112a, 112b, 112c . . . 112k.

A transport gear 268 is located below the pickup position 254a and is driven by a drive motor 270. The transport gear 268 is designed to engage the component carrier tape for motion, using teeth on the gear 268 to engage corresponding perforations in the tape. The tape is typically transported in steps, which is controlled by an electronic control unit 272. Guidance of the tape 266 from the reel 252, to the transport gear 268 is effected via a slightly bent, first guide element 274, a corner pulley 276 and a first guidance channel 278.

As the tape 266 advances through the feeder 112a, but prior to it reaching the pickup position 254a, a cover portion of the tape is removed from the supply tape portion by a pull-off device 280. After advancing beyond the pull-off device 280, the supply tape portion continues to the pickup position 254a. Beyond the pickup position 254a, the supply tape portion passes around the transport gear 268, through a curved, second guidance channel 282 and then through a substantially straight, third guidance channel 284. The supply tape portion is then directed downward and out of the feeder 112a by a further guidance element 286.

Beyond the pulloff device 280, the removed cover tape portion passes, without any further guidance, past the control unit 272 to a deflector shaft 288 and is there deflected downward. At the deflector shaft 288, the cover tape portion is also turned 90 degrees from the tape axis so that the surface of the cover tape portion is orientated roughly parallel to the base plate 258. The combined deflection and turning of the cover tape portion is achieved by the deflector shaft 288 that is lying in the plane of the removed cover tape portion and by the deflector shaft 288 enclosing an angle of around 45 degrees with the direction of travel of the cover tape portion.

The deflector shaft 288 is positioned adjacent to the base plate 258 so that the cover tape portion can be placed easily around the deflector shaft 288 and guided below the deflector shaft 288 safely past the component carrier tape 266 also running past there. A recess 290 is provided in the base plate 258 adjacent the deflector shaft 288 and in the area between the deflector shaft 288 and a cover tape drive unit 292. The cover tape portion is led past the component carrier tape 266 in its orientation turned through 90 degrees. A guide element 294 is provided to guide the cover tape portion in the recess 290. The guide element 294 has roughly the shape of a stationary stirrup positioned laterally to the direction of motion of the cover tape portion.

The cover tape portion is transported (i.e., pulled) by the drive unit 292, which is driven by a separate drive motor 296. In certain implementations, the cover tape portion may be collected onto a take up reel (not illustrated). The drive unit 292 is positioned below the guide element 294 at the lower edge of the recess 290. The drive unit 292 for the cover tape portion lies in the tape plane, i.e., the drive axle is parallel to the tape plane or to the base plate 258. To insert the cover tape, a flipup top part can be opened and then closed again in a known manner on the drive unit 292.

The feeder 112a can be inserted into the placement machine 210 by means of the handle 260 with its front section, in which the transport gear 268 is positioned, mating with a corresponding mount (not shown) in the placement machine 210. A guide pin 298 at the top and a guide nose 299 located on the bottom side of the feeder 112a serve to guide and center the feeder 112a within the placement machine 210. A connection to the placement machine 210 for the exchange of electrical signals is created by a multiple plug contact 297 positioned between the guide pin 162 and the guide nose 164.

A data module 116 and a communications module 117 are securely fastened to the reel 252 of electronic components. The data module 116 and the communications module 117 may remain attached to the reel 252 at all times. However, in certain instances, the data module 116 and the communications module 117 may be removed from the reel 252 and placed in a section of the feeder 112a proximate the pickup position 154a. This relocation of the modules 116, 117 would typically be accomplished when the reel 252 is coupled to the feeder 112a.

As an alternative arrangement, the communications module 117 may be permanently secured to the feeder 112a and the data module 116 may be secured alone to the reel for motion therewith. In such a case, a communications link (such as the communications link 113 of FIG. 1) would be established between the data module 116 and the communications module 117 when the associated reel 252 is mounted to the feeder 112a. Although not visible, it should be understood that each reel of components or feeder has a corresponding data module 116 and communications module 117 attached to it.

It should be understood that the data module 116 includes a battery, a sensing element, a processing unit and a memory storage device. Additionally, the communications module 117 includes a battery and a data module transceiver. Alternatively, the communications module 117 may be powered by a different power source, such as a wall outlet. The data module 116 and the communications module 117 may be replaced as a unit or individually.

A pick head transceiver 120 is securely fastened to the pick head 114 for motion therewith. As the pick head 114 moves proximate a selected feeder, for example, feeder 112a, a duplex communications channel 122 is established between the pick head transceiver 120 and the associated communications module 117. This communications channel 122 may be either a hardwired connection or, preferably, a wireless connection. The wireless connection may be either infrared based or radio-frequency based. If the connection is infrared based, it may be necessary to position the pick head 114 in such a manner that the pick head transceiver 120 will be within the line of sight of the communications module 117 to properly establish the communications channel 122. If, on the other hand, radio-frequency based technology is used, a line of sight connection may not be necessary. In that case, the pick head 114 would likely be positioned in such a manner that the pick head transceiver 120 is closer to the communications module 117 of a selected feeder 112a than it is to the communication modules 117 of adjacent feeders.

The electronic component placement machine 210 also includes a series of slot markers 150a, 150b, 150c . . . 150k. These slot markers 150a, 150b, 150c . . . 150k maybe, for example, bar codes or any other device or article that is capable of containing identification data. Each marker 150a, 150b, 150c . . . 150k identifies a particular slot location. The pick head transceiver 120 is capable of reading the slot markers 150a, 150b, 150c . . . 150k and does so, generally, before removing a component from the associated feeder 112a, 112b, 112c . . . 112k.

A circuit board identification marker 148 is attached to each circuit board 115a, 115b . . . 115k. These identification markers 148 include various information, such as part numbers, serial numbers, etc. associated with the respective circuit board. The pick head transceiver 120 can also read these markers 148.

Figure 3A:
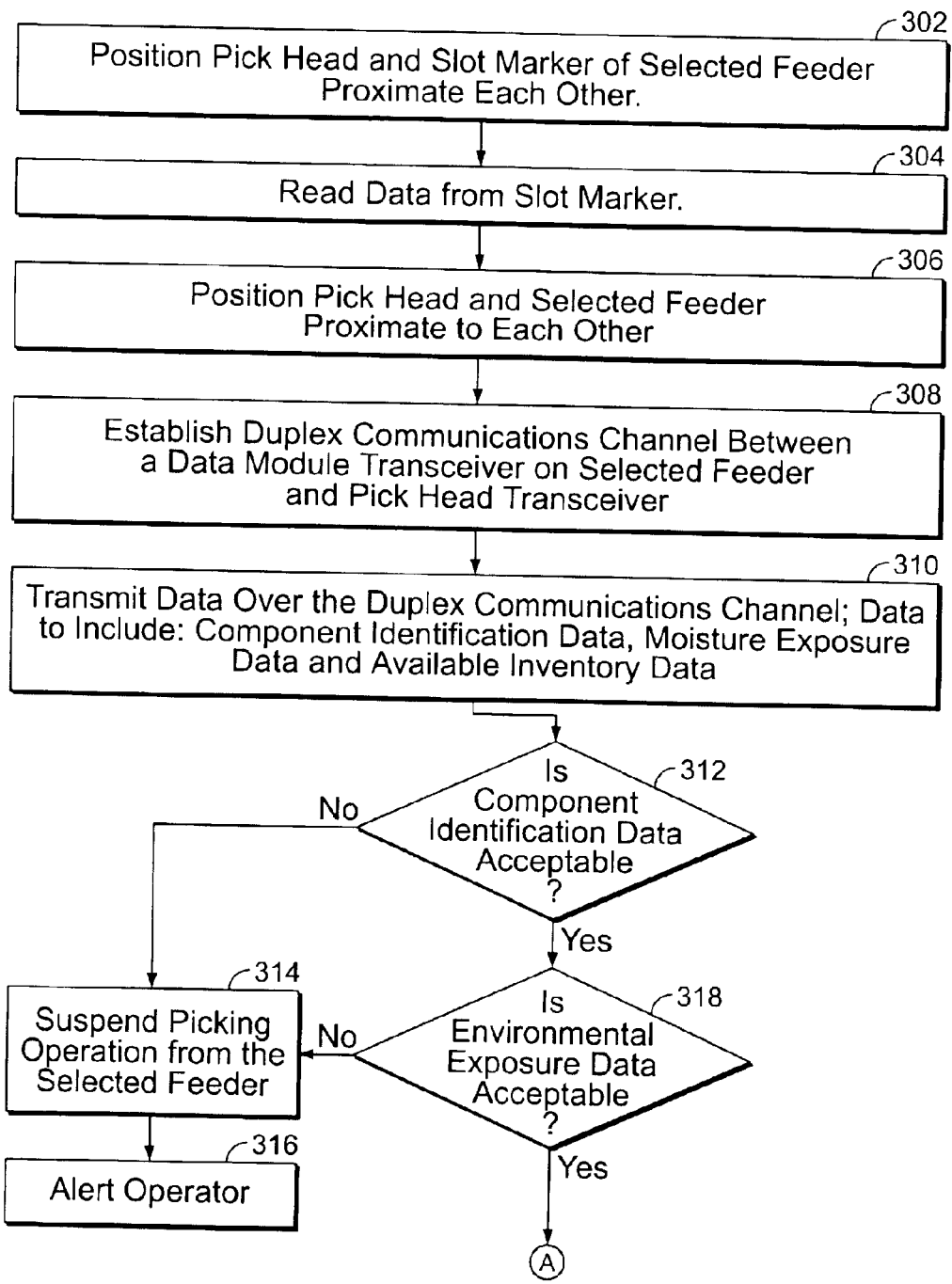
FIG. 3 is a flow diagram for a transaction between a data module/communications module and a pick head transceiver.
Figure 3B:
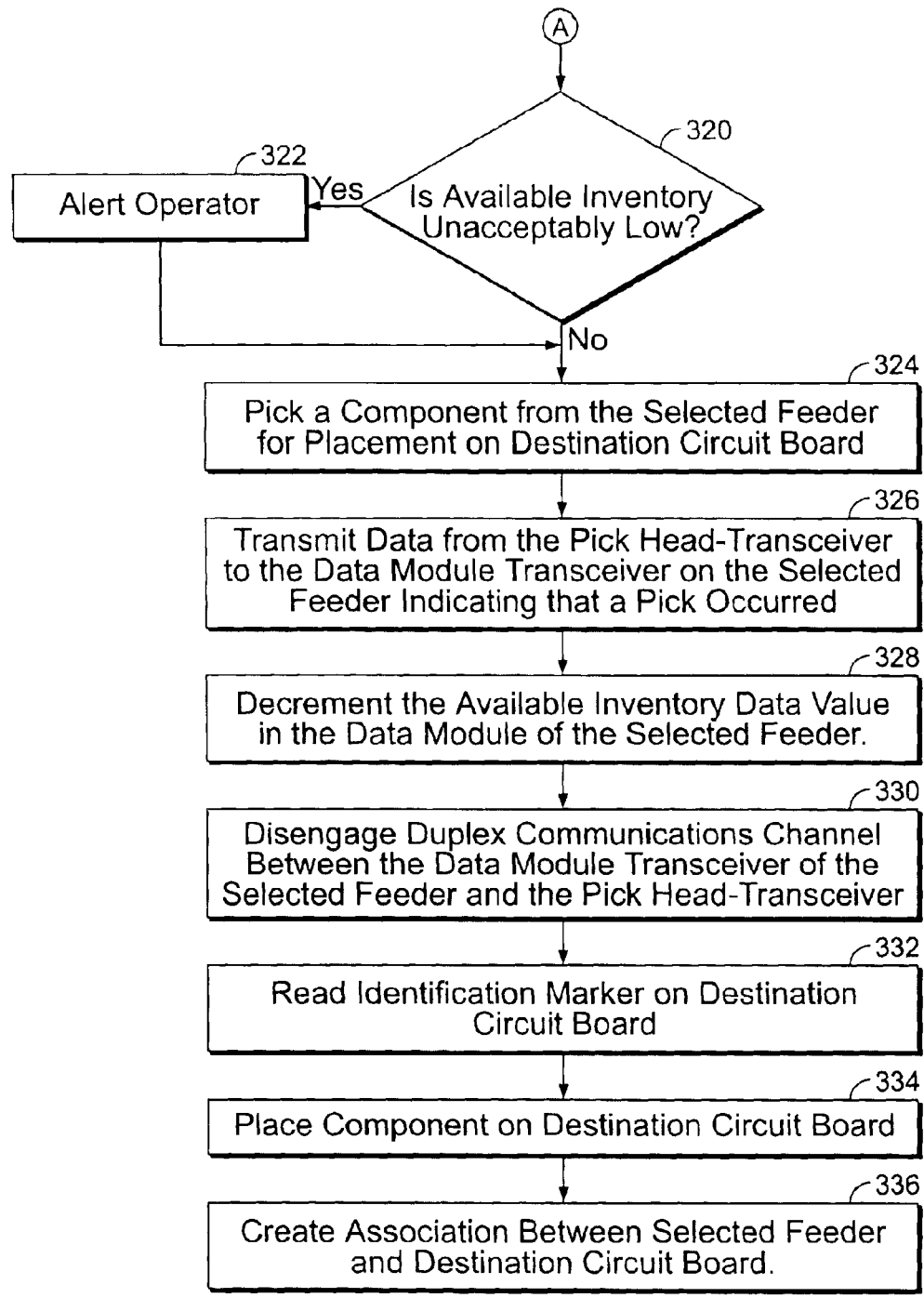

Referring now to FIG. 3, an exemplary transaction between a data module 116/communications module 117 and a pick head transceiver 120 is shown. The transaction is initiated when a pick head 114, and its corresponding pick head transceiver 120, are positioned 302 proximate a slot marker 150 of a selected feeder 112. The pick head transceiver 120 then reads 304 data from the slot marker 150. This data may be stored by the pick head transceiver 120 either locally or remotely.

Figure 4:
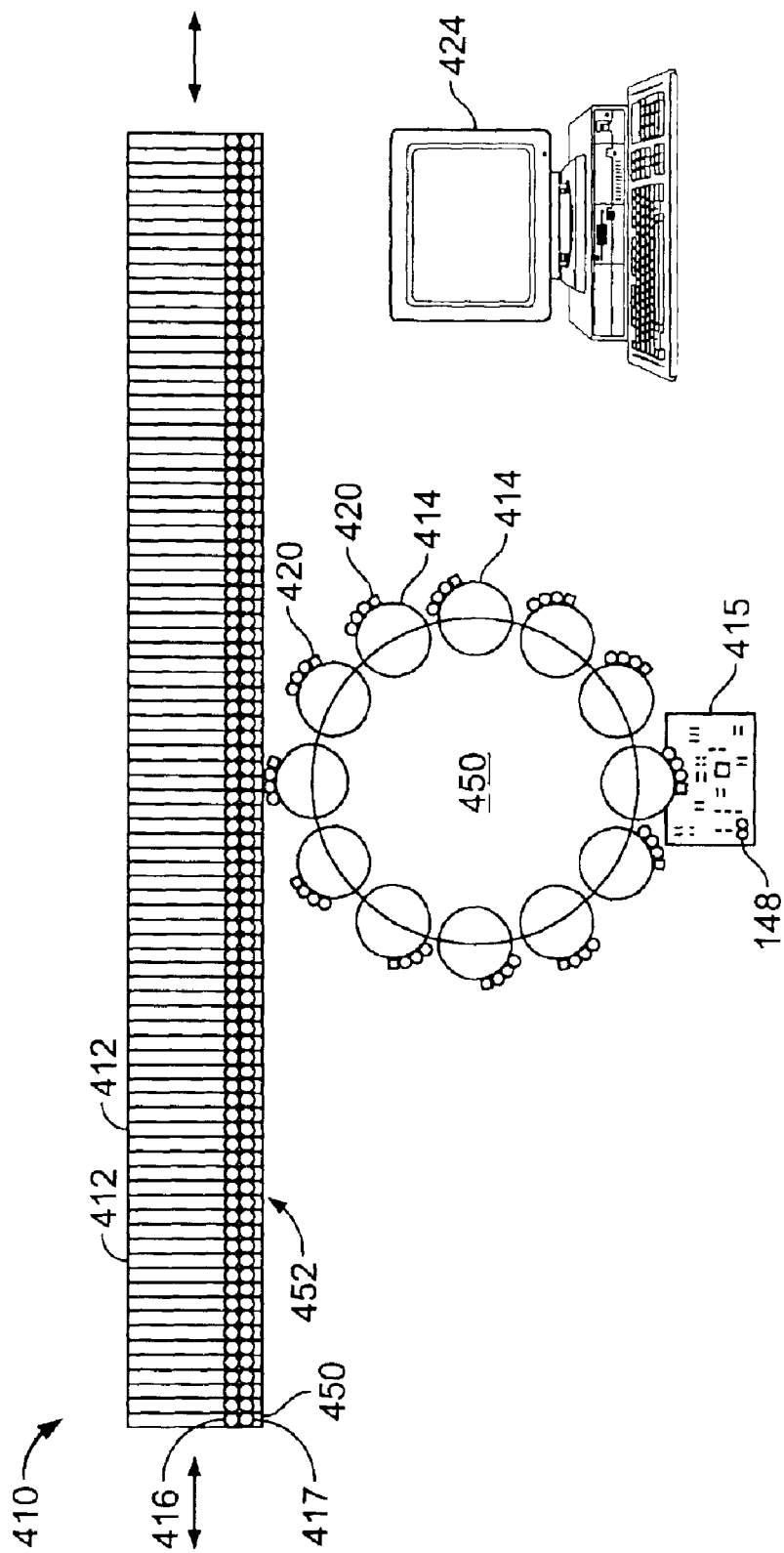
FIG. 4 illustrates an alternative component placement machine arrangement.

Next, the pick head 114 is positioned 306 proximate the selected feeder 112 so that a duplex communications channel 122 can be established there between. Depending on the particular configuration of the electronic component placement machine 110, this may be done in a variety of ways. For example, if the electronic component placement machine 110 includes a plurality of stationary feeders, such as feeders 112a, 112b, 112c . . . 112k and a movable pick head 114, the pick head 114 may be moved to a position that will facilitate the removal of components from a selected feeder, such as feeder 112a. Alternatively, if the placement machine 110 includes several pick heads 114 located around the periphery of a rotatable turret and a row of feeders that are movable in unison along a linear axis (as illustrated in FIG. 4), both the pick head 114 and the row of feeders 112 may be moved simultaneously so that a particular pick head 114 ends up proximate a selected feeder 112.

The communications channel 122 is then established 308 between the data module transceiver 118 of the selected feeder and the pick head transceiver 120 as the pick head 114 moves into position. The communications channel 122 can be established in a number of possible ways. For example, the communications channel 122 may be based on radio frequency (RF) technology and be automatically established based on the proximity of the pick-head transceiver 120 to the data module transceiver 118 of the selected feeder 112. Alternatively, the communications channel 122 may be based on infrared (IR) technology and be established when the pick head transceiver 120 and the data module transceiver 118 are positioned so that an infrared signal is transferable therebetween along a line-of-sight. Furthermore, the communications channel 122 could be hard-wired and be established by a set of switches that connect the data module transceiver 118 to the appropriate pick head transceiver 120 based on the relative positions of each.

Next, a variety of data can be transmitted 310 over the communications channel 122 between the pick head transceiver 120 and the data module transceiver 118. For example, the data module transceiver 118 may transmit component identification data, environmental condition exposure data, and available inventory data to the pick head transceiver 120. The component identification data may identify the model numbers, serial numbers, lot numbers and manufacturer of the discrete electronic components on the feeder 112, as well as any additional information that may be useful in identifying the source and characteristics of the electronic components in question. The environmental condition exposure data can indicate the extent to which the electronic components of the feeder have been exposed to, for example, moisture, vibration, shock, excessive heat, etc. Monitoring of environmental conditions associated with a set of electronic components was described in U.S. patent application Publication No. US 2003/0030429 A1, Kou, filed Aug. 8, 2001, which is hereby incorporated entirely by reference in the present application. The available inventory data would indicate the number of discrete electronic components available at any given time on the feeder 112. The pick head transceiver 120 may store and/or process this information as needed to facilitate component verification, component destination tracking and component suitability for installation. As another example of data transmitted over the duplex communications channel 122, the pick head transceiver 120 may transmit a signal indicating that the pick head 114 will remove a component from the associated feeder. In response to such a signal, the data module transceiver 118 may decrement the available inventory value stored in memory (e.g., either 136 or 142). As one skilled in the art would recognize, it may be desirable to transmit many other types of data not specifically mentioned herein. The transmitting of these other types of data should be considered within the scope of this invention.

The pick head transceiver 120 can process the transmitted data either locally using processor 144 and memory unit 146, or it could send the data to a remote computer 124 for processing. Assuming the processing is performed locally, the pick head transceiver 120 determines 312 whether the transmitted component identification data is acceptable. To do this, the pick head transceiver 120 may check the transmitted data against a predetermined sequence of data associated with a desired parts installation. In other words, the pick head transceiver 120 confirms that the correct component is being installed, for example, by comparing the transmitted component model number to information specifying the desired part according to the particular circuit board assembly program being run by the electronic component placement machine 110. The pick head transceiver 120 may also check the manufacturer identification number, the component serial number and/or the lot number in a similar manner to ensure, for example, that the particular component removed from the source reel has not been recalled. Additionally, the pick head transceiver 120 may check the configuration of component feeders as described in U.S. Pat. No. 6,027,019, Kou, filed Sep. 10, 1997, and in U.S. patent application Ser. No. 09/723,202, Kou, filed Nov. 27, 2000, which are hereby incorporated by reference, in the present application. Such feeder configuration monitoring can guard against some of the typical loading errors that can occur even with the most conscientious machine operators.

If the transmitted component identification data is unacceptable, the computer 124 suspends 314 the picking operation from the selected feeder 112 and alerts 316 the machine operator appropriately. Subsequently, the electronic component placement machine 110 may either continue assembling circuit boards by using components from different feeders only, or, perhaps, suspend operations entirely.

If the transmitted component identification data is acceptable, then the pick head transceiver 120 next determines 318 whether the environmental exposure data associated with the electronic components of the selected feeder 112 is acceptable. For example, the data may indicate that the electronic components had been exposed to too much moisture and that subsequent problems would be likely.

If the transmitted environmental exposure data is unacceptable, the computer 124 suspends 314 picking from the selected feeder 112 and alerts 316 the operator in an appropriate manner. Subsequently, the electronic component placement machine 110 may either continue assembling circuit boards by using components from other feeders only, or, perhaps suspend operations entirely.

If the transmitted environmental exposure data is acceptable, then the pick head transceiver 120 determines 320 whether the available inventory at the selected feeder 112 is unacceptably low. To accomplish this, the pick head transceiver 120 can compare the transmitted data with some predetermined minimum threshold value stored in memory, below which the supply of components should desirably be refreshed. If the available inventory is unacceptably low, the pick head transceiver 120 alerts 322 the machine operator in an appropriate manner.

Next, the pick head 114 removes 324 an electronic component from the selected feeder 112. The pick head transceiver 120 transmits 326 data to the data module transceiver 118 indicating that a component has been removed from the selected feeder 112. In response to receiving this signal, the data module transceiver 122 can then decrement 328 the available inventory data value stored in memory.

Next, the pick head 114 and the selected feeder 112 are moved apart 226 from each other. As the pick head 114 and the selected feeder 112 are moved apart, the communications channel 122 therebetween is disengaged 330.

The pick head 114 then carries the removed component toward a destination circuit board 115. As the pick head 114 approaches the destination circuit board 115, the pick head transceiver 120 reads 332 data from the circuit board identification marker 148. This data may include, for example, a part number of the circuit board being manufactured, its serial number, intended customer, etc. This data may be stored and/or processed either locally or remotely.

The pick head 114 then places 334 the electronic component upon the destination circuit board 115. The pick head transceiver 120 creates 336 an association between the selected feeder 112, from which the component was removed and the destination circuit board 115, upon which the component was placed. This association may be stored either locally or remotely.

Those possessing ordinary skill in the art will recognize that the order of steps recited above, and detailed in FIG. 3 may be modified in numerous ways. Such modifications should also be considered within the scope of this application.

FIG. 4 illustrates an alternative arrangement of a component placement machine 410 that includes a rotatable turret 450 having several pick heads 414 located about its periphery. Each pick head 414 is configured to pick individual components from the feeders 412, which are mounted on a movable feeder platform 452 on one side of turret 450 and to place the picked components in predetermined positions on a destination circuit board 415 on the other side of the turret 450. Feeder platform 452 moves back and forth (along the feeder platform) to present the desired feeder 412 to each pick head 414, and can typically hold between about seventy and one hundred fifty feeders.

Before mounting feeders 412 in their respective slots on feeder platform 452, they are loaded with reels of components as illustrated in FIG. 2. Each feeder 412 is designed to accept several different types of components for assembling a wide range of circuits and products. The loaded feeders 412 are then mounted in slots according to an arrangement prescribed by a placement program that is loaded into a placement machine controller, which, in the illustrated embodiment is a computer 424. The placement program contains, among other things, a prescribed association between machine slot numbers and component part numbers.

Each feeder 412 (or reel of components) has a data module 416 and a communications module 417 coupled thereto. Each pick head 414 includes a pick head transceiver 420 securely fastened thereto. As described above, the communications modules 417 and the pick head transceivers 420 can communicate various information with each other over a duplex communications channel. This duplex communications channel may be either hard-wired or wireless. Moreover, the pick head transceivers 420 are capable of reading data from slot markers 450 and identification markers 448 of destination circuit boards 415.

Figure 5:
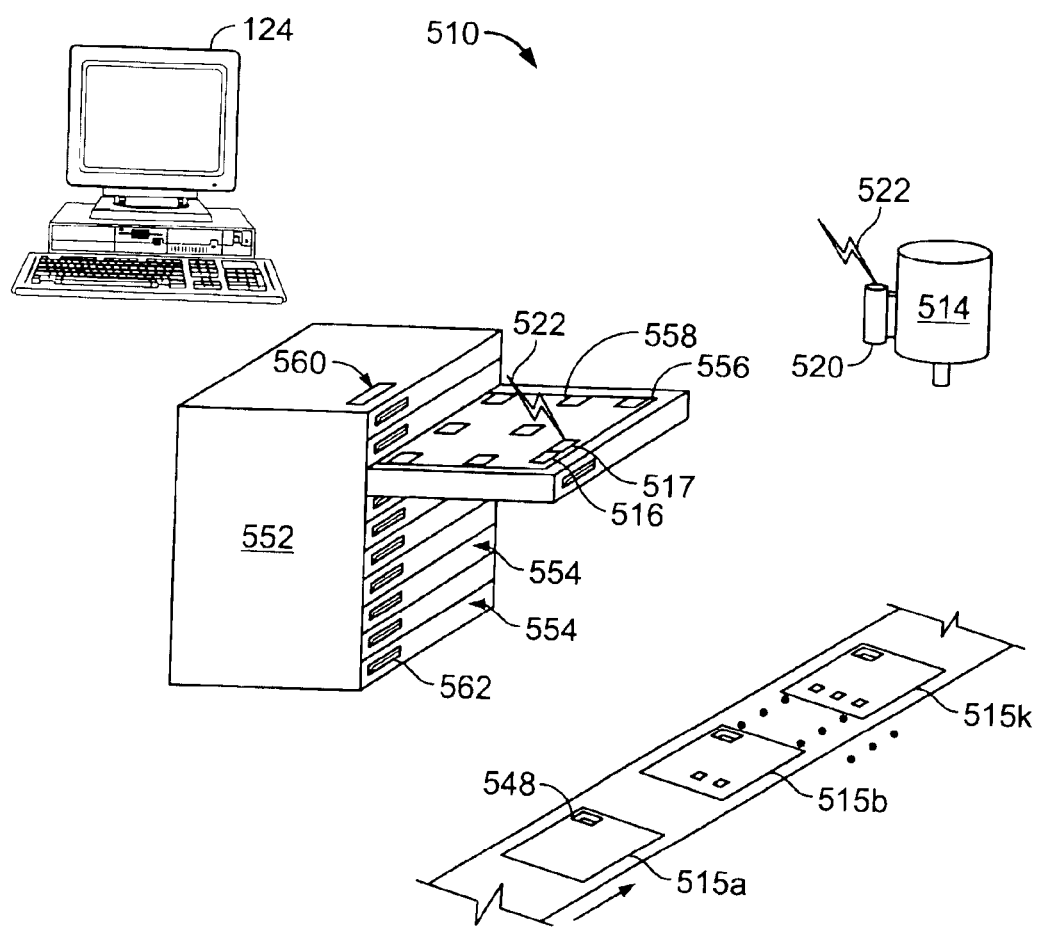
FIG. 5 illustrates another alternative component placement machine arrangement.

FIG. 5 illustrates yet another alternative arrangement for an electronic component placement machine 510. This arrangement includes a tower 552 of drawers 554, with each drawer containing a tray 556 of discrete electronic components 558. It should be understood that the term "feeder" as used herein encompasses the concept of a tower arrangement. A pick head 514 is capable of removing a component from a selected drawer 554/tray 556, carrying that component to a destination circuit board, for example 515b, and placing the component thereupon. A pick head transceiver 520 is securely coupled to the pick head 514 for motion therewith. Each drawer contains a data module 516 and a communications module 517 (with a data module transceiver) therein.

The pick head transceiver 520 is capable of communicating with the data module transceiver over a duplex communications channel 522. An identification marker 560, which may be, for example a bar code, is attached to the tower 552. This identification marker 560 includes data sufficient to identify and distinguish the tower 552. Additionally, each drawer 554 includes a similar identification marker 562, such as a bar code, with enough information to identify each particular drawer 554. Likewise, each circuit board 515a, . 5b . . . 515k includes an identification marker 548. The pick head transceiver 520 can read data from the tower identification marker 560, the drawer information markers 562 and the circuit board identification markers 548.

A number of implementations of the invention have been described. Nevertheless, it will be understood that various modifications and applications of the concepts described herein may be made without departing from the spirit and scope of the invention. For example, the pick head transceiver may be configured to communicate with the communications module, and other devices/transceivers may be secured to the pick head to read data from a slot marker and from a circuit board identification marker. Additionally, the concepts described herein may be extended to other industries, such as, for example, the pharmaceuticals manufacturing industry. Accordingly, other implementations are within the scope of the following claims.

What is claimed is:

1. An electronic component placement machine comprising:
   a series of feeders adapted to supply discrete electronic components for subsequent placement onto a destination circuit board;
   a data module coupled to each feeder, each data module comprising a memory storage device;
   a communications module coupled to each feeder, each communications module comprising a data module transceiver that is coupled to the memory storage device;
   a pick head, movable between selected feeders for sequentially picking the discrete electronic components from a respective feeders for subsequent placement onto a destination circuit board; and
   a pick head transceiver secured to the pick head for movement therewith, the pick head transceiver adapted to communicate over a duplex communications channel with the data module transceiver of a selected feeder when the pick head is positioned to remove components from the selected feeder.

2. The electronic component placement machine of claim 1 wherein the data module is securely coupled to a reel of electronic components mounted to the feeder.

3. The electronic component placement machine of claim 1 wherein the data module is securely coupled to a tray of electronic components and wherein the tray of electronic components is coupled to the feeder.

4. The electronic component placement machine of claim 1 wherein the memory storage device is adapted to store a remaining inventory value that indicates the number of discrete electronic components that are available at the associated feeder; and
   wherein the data module transceiver is adapted to transmit the stored remaining inventory value to the pick head transceiver over the duplex communications channel.

5. The electronic component placement machine of claim 4:
   wherein the data module further comprises a processing unit; and
   wherein the pick head transceiver is adapted to transmit a signal to the data module transceiver to indicate that the pick head has removed a component from the selected feeder and the processing unit is adapted to update the remaining inventory value in the memory storage device in response to the received signal.

6. The electronic component placement machine of claim 4 wherein the pick head transceiver comprises:
   a memory storage unit adapted to store values that indicate a minimum acceptable inventory of available electronic components at each feeder; and
   a processing unit coupled to the memory storage unit;
   wherein the processing unit is adapted to compare the transmitted remaining inventory value with the stored minimum acceptable inventory value associated with the selected feeder.

7. The electronic component placement machine of claim 1 wherein each data module further comprises:
   a sensing element responsive to atmospheric moisture content; and
   a processing unit adapted to store data associated with sensed atmospheric moisture content over time in the memory storage device.

8. The electronic component placement machine of claim 7 wherein the data module-transceiver is adapted to transmit the data associated with sensed atmospheric moisture content over time to the pick head transceiver over the duplex communications channel.

9. The electronic component placement machine of claim 7 wherein the processing unit is further adapted to determine, based on the stored data associated with the sensed atmospheric moisture content over time, whether the electronic components of the selected feeder are suitable for subsequent placement upon the destination circuit board.

10. The electronic component placement machine of claim 9 wherein the data module transceiver is adapted to transmit data indicating suitability for installation of the electronic components of the selected feeder to the pick head-transceiver over the duplex communications channel.

11. The electronic component placement machine of claim 1 wherein the duplex communications channel utilizes wireless technology.

12. The electronic component placement machine of claim 11 wherein the wireless technology comprises radio-frequency transmission.

13. The electronic component placement machine of claim 11 wherein the wireless technology comprises infrared transmission.

14. The electronic component placement machine of claim 1 wherein the memory storage device is adapted to store identification data associated with the discrete electronic components of the associated feeder.

15. The electronic component placement machine of claim 14 wherein the data module transceiver is adapted to transmit the stored component identification data to the pick head-transceiver.

16. The electronic component placement machine of claim 15 wherein the pick head transceiver comprises:
   a memory unit; and
   a processor coupled to the memory unit;
   wherein the processor is adapted to store the transmitted component identification data in the memory unit.

17. The electronic component placement machine of claim 16 wherein the pick head transceiver is adapted to read data from an identification marker that is secured to the destination circuit board and to create an association between the stored component identification data and the circuit board identification data associated with the destination circuit board.

18. The electronic component placement machine of claim 16 wherein the memory unit is adapted to store a predetermined sequence of data associated with a desired parts installation; and
   wherein the processor is adapted to compare the communicated identification data with the predetermined sequence of data.

19. The electronic component placement machine of claim 18 wherein the processor is adapted to alert an operator if the communicated identification data does not match the predetermined sequence of data.

20. The electronic component placement machine of claim 7 wherein the data module is detachable from the communications module.

21. The electronic component placement machine of claim 1 wherein the data module comprises a first power source and the communications module comprises a second power source dedicated to the data module transceiver.

22. The electronic component placement machine of claim 1 further comprising a plurality of pick heads coupled to a periphery of a rotatable turret and wherein the plurality of feeders are arranged in linear fashion and are movable in a linear direction.

23. A method of operating an electronic component placement machine comprising:
   positioning a pick head proximate a selected one of a plurality of electronic component feeders;
   establishing a duplex communication channel between a pick head transceiver coupled to the pick head and a data module transceiver coupled to the selected feeder;
   transmitting operational data between the pick head transceiver and the data module transceiver over the duplex communications channel;
   disengaging the duplex communications channel; and
   positioning the pick head proximate a second selected feeder.

24. The method of claim 23 wherein the plurality of feeders are arranged in a linear fashion and are stationary; and
   wherein positioning the pick head comprises moving the pick head.

25. The method of claim 23 wherein the pick head is one of a plurality of pick heads coupled to a periphery of a rotatable turret and wherein the plurality of feeders are arranged in linear fashion and are movable in a linear direction; and
   wherein positioning the pick head and the selected feeder proximate each other comprises rotating the turret and moving the plurality of feeders in the linear direction.

26. The method of claim 23 wherein the plurality of feeders comprises a plurality of trays; and
   wherein positioning the pick head and the selected feeder proximate each other comprises positioning the pick head above a selected tray.

27. The method of claim 23 wherein the duplex communications channel comprises a wireless communications channel.

28. The method of claim 27 wherein the wireless communications channel is adapted to implement infrared based communication technology.

29. The method of claim 27 wherein the wireless communications channel is adapted to implement radio-frequency based communication technology.

30. The method of claim 23 wherein the duplex communication channel is a hard wired communication channel.

31. The method of claim 23 wherein the duplex communications channel is established when the pick head and the selected feeder are proximate each other.

32. The method of claim 23 wherein transmitting the operational data comprises transmitting identification data associated with the electronic components of the selected feeder from the data module transceiver to the pick head transceiver.

33. The method of claim 32 further comprising determining whether the transmitted identification data matches a predetermined sequence of data associated with a desired parts installation.

34. The method of claim 23 wherein transmitting the operational data comprises transmitting moisture exposure data associated with the electronic components of the selected feeder from the data module transceiver to the pick head transceiver.

35. The method of claim 34 further comprising alerting an operator if the transmitted moisture exposure data is not acceptable.

36. The method of claim 34 further comprising preventing the pick head from picking a component from the selected feeder if the transmitted moisture exposure data is not acceptable.

37. The method of claim 23 wherein transmitting the operational data comprises transmitting data that indicates available inventory at the selected feeder from the data module transceiver to the pick head transceiver.

38. The method of claim 37 further comprising alerting an operator if the transmitted available inventory data indicates a value below a predetermined threshold value.

39. The method of claim 23 further comprising removing an electronic component from the selected feeder; and wherein transmitting the operational data comprises sending a signal from the pick head transceiver to the data module transceiver indicating that a component has been removed.

40. The method of claim 39 further comprising updating an available inventory value associated with the selected feeder and storing the updated value in a memory storage device coupled to the selected feeder.

* * * * *